(12) United States Patent
Hoffman et al.

(10) Patent No.: US 9,142,388 B2
(45) Date of Patent: *Sep. 22, 2015

(54) CAPACITIVELY COUPLED REMOTE PLASMA SOURCE

(71) Applicant: Advanced Energy Industries, Inc., Fort Collins, CO (US)

(72) Inventors: Daniel J. Hoffman, Fort Collins, CO (US); Daniel Carter, Fort Collins, CO (US); Victor Brouk, Fort Collins, CO (US); Karen Peterson, Loveland, CO (US); Randy Grilley, Pierce, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/227,583

(22) Filed: Mar. 27, 2014

(65) Prior Publication Data
US 2014/0210345 A1 Jul. 31, 2014

Related U.S. Application Data

(63) Continuation of application No. 13/356,546, filed on Jan. 23, 2012, now Pat. No. 8,723,423.

(51) Int. Cl.
*H01J 7/24* (2006.01)
*H01J 37/32* (2006.01)
*H05H 1/46* (2006.01)

(52) U.S. Cl.
CPC ....... *H01J 37/32091* (2013.01); *H01J 37/3244* (2013.01); *H01J 37/32357* (2013.01); *H01J 37/32568* (2013.01); *H05H 1/46* (2013.01); *H05H 2001/4675* (2013.01)

(58) Field of Classification Search
CPC .................................. H01J 37/32091
USPC ........................ 315/111.21, 111.51
See application file for complete search history.

(56) References Cited

U.S. PATENT DOCUMENTS 5,354,413 A * 10/1994 Smesny et al. ........... 156/345.47
5,487,785 A     1/1996 Horiike et al.
(Continued)

FOREIGN PATENT DOCUMENTS

JP      04-193329 A      7/1992
JP      06219718         8/1994
(Continued)

OTHER PUBLICATIONS

Jeon, M., et al., "Hydrogenated amorphous silicon film as intrinsic passivation layer deposited at various temperatures using RF remo . . . ", Current Applied Physics, Nov. 12, 2009, pp. S237-S240, vol. 10, No. (2010), Publisher: Elsevier B.V., Published in: US.
(Continued)

*Primary Examiner* — Tung X Le
*Assistant Examiner* — Srinivas Sathiraju
(74) *Attorney, Agent, or Firm* — Neugeboren O'Dowd PC

(57) ABSTRACT

This disclosure describes systems, methods, and apparatus for capacitively coupling energy into a plasma to ignite and sustain the plasma within a remote plasma source. The power is provided by a first electrode that at least partially surrounds or is surrounded by a second electrode. The second electrode can be grounded or floating. First and second dielectric components can be arranged to separate one or both of the electrodes from the plasma and thereby DC isolate the plasma from one or both of the electrodes.

13 Claims, 11 Drawing Sheets

(56) References Cited

U.S. PATENT DOCUMENTS

| | | | |
|---|---|---|---|
| 5,859,428 A | 1/1999 | Fruchtman | |
| 6,156,667 A | 12/2000 | Jewett | |
| 6,291,938 B1 | 9/2001 | Jewett et al. | |
| 6,326,584 B1 | 12/2001 | Jewett et al. | |
| 6,392,210 B1 | 5/2002 | Jewett et al. | |
| 6,707,051 B2 | 3/2004 | Shun'ko | |
| 6,724,148 B1 * | 4/2004 | Gonzalez et al. | 315/111.21 |
| 6,819,096 B2 | 11/2004 | Gonzalez et al. | |
| 6,822,396 B2 | 11/2004 | Gonzalez et al. | |
| 6,927,358 B2 | 8/2005 | Gonzalez et al. | |
| 6,946,063 B1 | 9/2005 | Gonzalez et al. | |
| 7,005,845 B1 | 2/2006 | Gonzalez et al. | |
| 7,245,084 B1 | 7/2007 | Gonzalez et al. | |
| 7,381,292 B2 * | 6/2008 | Lee et al. | 156/345.48 |
| 7,453,191 B1 * | 11/2008 | Song | 313/231.31 |
| 7,468,494 B2 | 12/2008 | Gonzalez et al. | |
| 8,222,822 B2 * | 7/2012 | Gilbert | 315/111.51 |
| 8,303,765 B2 * | 11/2012 | Okita et al. | 156/345.48 |
| 8,314,560 B2 * | 11/2012 | Nakagami et al. | 315/111.21 |
| 8,415,885 B2 * | 4/2013 | Yamazawa | 315/111.51 |
| 8,723,423 B2 * | 5/2014 | Hoffman et al. | 315/111.51 |
| 2001/0014540 A1 * | 8/2001 | Shan et al. | 438/710 |
| 2004/0094402 A1 | 5/2004 | Gopalraja et al. | |
| 2006/0130971 A1 * | 6/2006 | Chang et al. | 156/345.48 |
| 2011/0095689 A1 | 4/2011 | Gilbert | |
| 2011/0135844 A1 * | 6/2011 | Sorensen et al. | 427/578 |
| 2011/0226617 A1 | 9/2011 | Hofmann et al. | |
| 2012/0217221 A1 | 8/2012 | Hoffman et al. | |
| 2014/0210345 A1 * | 7/2014 | Hoffman | 315/111.21 |

FOREIGN PATENT DOCUMENTS

| | | |
|---|---|---|
| JP | 2005322416 | 11/2005 |
| JP | 2008041495 | 2/2008 |
| JP | 2008506235 | 2/2008 |
| WO | 2006103945 A1 | 5/2006 |
| WO | 2007040020 A1 | 12/2007 |
| WO | 2012103101 A1 | 8/2012 |

OTHER PUBLICATIONS

Bruno, G., et al., "Real time ellipsometry for monitoring plasma-assisted epitaxial growth of GaN", "Applied Surface Sci.", Jul. 7, 2006, pp. 219-223, vol. 253, No. (2006), Publisher: Elsevier B.V., Published in: US.

Giangregorio, M.M., et al., "Role of plasma activation in tailoring the nanostructure of multifunctional oxides thin films", "Applied Surface Sci.", Sep. 10, 2008, pp. 5396-5400, vol. 255, No. (2009), Publisher: Elsevier B.V., Published in: US.

Hoffman, D., et al., "Specification for related U.S. Appl. No. 13/173,752, filed Jun. 30, 2011", p. 48 Published in: US.

Hoffman, D., et al., "Specification for related U.S. Appl. No. 13/425,159, filed Mar. 20, 2012", p. 33 Published in: US.

Vahedi, V., et al., "Verification of frequency scaling laws for capacitive radio-frequency discharges using two-dimensional simulations", "Phys. Fluids B", Jul. 1993, pp. 2719-2729, vol. 5, No. 7, Publisher: Am. Inst. of Physics, Published in: US.

Rauf, S., et al., "Nonlinear Dynamics of Radio Frequency Plasma Processing Reactors Powered by Multifrequency Sources", "IEEE Transactions on Plasma Science", Oct. 5, 1999, pp. 1329-1338, vol. 27, No. 5, Publisher: IEEE.

Raoux, S., et al., "Remote microwave plasma source for cleaning chemical vapor deposition chambers; Technology for reducing global warm . . . ", "J. Vac. Sci. Technol. B Mar./Apr. 1999", 1999, pp. 477-485, vol. 17, No. 2, Publisher: Am. Vacuum Soc'y, Published in: US.

Gangoli, S.P., et al., "Production and transport chemistry of atomic fluorine in remote plasma source and cylindrical reaction chamber", "J. Phys. D: Appl. Phys.", Aug. 16, 2007, pp. 5140-5154, vol. 40, No. (2007), Publisher: IOP Publishing Ltd., Published in: UK.

Yun, Y.B., et al., "Effects of various additive gases on chemical dry etching rate enhancement of low-k SiOCH layer in F2/Ar remote plasmas", "Thin Solid Films", Aug. 15, 2007, pp. 3549-3553, vol. 516, No. (2008), Publisher: Elsevier B.V., Published in: US.

Kuo, M.S., et al., "Influence of C4F8/Ar-based etching and H2-based remote plasma ashing processes on ultralow k materials modifications", "J. Vac. Sci. Technol. B, Mar./Apr. 2010", Mar. 19, 2010, pp. 284-294, vol. 28, No. 2, Publisher: Am. Vacuum Soc'y, Published in: US.

Heil, S.B.S., et al., "Deposition of TiN and HfO2 in a commercial 200 mm plasma atomic layer deposition reactor", "J. Vac. Sci. Technol. A, Sep./Oct. 2007", Jul. 31, 2007, pp. 1357-1366, vol. 25, No. 5, Publisher: Am. Vacuum Soc'y, Published in: US.

Kim, J.Y., et al., "Remote plasma enhanced atomic layer deposition of TiN thin films using metalorganic precursor", "J. Vac. Sci. Technol. A, Jan./Feb. 2004", Nov. 13, 2003, pp. 8-12, vol. 22, No. 1, Publisher: Am. Vacuum Soc'y, Published in: US.

Wakeham, S.J., et al., "Low temperature remote plasma sputtering of indium tin oxide for flexible display applications", "Thin Solid Films", May 12, 2009, pp. 1355-1358, vol. 519, No. (2009), Publisher: Elsevier B. V.

Ohachi, T., et al., "Measurement of nitrogen atomic flux for RF-MBE growth of GaN and AlN on Si substrates", "J. of Crystal Growth", Jan. 20, 2009, pp. 2987-2991, vol. 311, No. (2009), Publisher: Elsevier B.V.

Honda, S., et al., "Hydrogenation of polycrystalline silicon thin films", "Thin Solid Films", Oct. 5, 2005, pp. 144-148, vol. 501, No. (2006), Publisher: Elsevier B.V., Published in: US.

Bryns, B., et al., "A VHF driven coaxial atmospheric air plasma: electrical and optical characterization", Dec. 16, 2011, pp. 1-18, No. Rev. 2-0, Publisher: N. C. St. U., Dep't of Nuclear Engr., Published in: US.

Emsellem, G., "Electrodeless Plasma Thruster Design Characteristics", Jul. 11, 2005, p. 22, Publisher: 41st Joint Propulsion Conference, Tucson, Published in: US.

George, M.A., et al., "Silicon Nitride Arc Thin Films by New Plasma Enhanced Chemical Vapor Deposition Source Technology", Jul. 7, 2011, pp. 1-5, Publisher: Article downloaded from www.generalplasma.com, Published in: US.

Krolak, M, "Matthew Krolak's MyElectricEngine.Com Megnetoplasmadynamic (MPD) Thruster Design", Apr. 28, 2011, p. 7 Publisher: Webpage downloaded from http://myelectricengine.com/projects/mpdthruster/mpdthruster.html, Published in: US.

Sathiraju, Srinivas, "Office Action re U.S. Appl. No. 13/356,546", Aug. 8, 2013, p. 32 Published in: US.

Rabbani, Firoozeh, "International Search Report and Written Opinion re application No. PCT/US2012/022380", Mar. 14, 2012, Published in: AU.

Becamel, Philippe, "International Preliminary Report on Patentability re Application No. PCT/US2012/022380", Aug. 8, 2013, p. 8 Published in: CH.

Devlin, Martin, "International Search Report and Written Opinion re application No. PCT/US2012/029953", May 28, 2012, p. 11 Published in: AU.

O'Dowd, Sean R., "Response to Office Action re U.S. Appl. No. 13/356,546", Feb. 7, 2014, p. 8, Published in: US.

Yamaguchi, Atsushi, "Japanese Office Action re Application No. 2013-551290", Jan. 19, 2015, p. 6, Published in: JP.

\* cited by examiner

CAPACITIVELY COUPLED REMOTE PLASMA SOURCE

CLAIM OF PRIORITY UNDER 35 U.S.C. §120

The present Application for Patent is a Continuation of patent application Ser. No. 13/356,546 entitled "ELECTROSTATIC REMOTE PLASMA SOURCE" filed Jan. 23, 2012, pending, and assigned to the assignee hereof and hereby expressly incorporated by reference herein.

FIELD OF THE INVENTION

The present invention relates generally to remote plasma sources. In particular, but not by way of limitation, the present invention relates to systems, methods and apparatuses for dissociating, ionizing and/or energizing a processing gas using a remote plasma source.

BACKGROUND OF THE INVENTION

Remote plasma sources (RPS) are used to produce activated gases containing ions, free radicals, atoms and molecules by passing a gas through a plasma that excites the gas. Activated gases and free radicals are used for numerous industrial and scientific applications including processing solid materials and/or thin films such as those found on semiconductor wafers, display panels, and other active device substrates. Activated or energized gases containing ions, dissociated atoms and free radicals are also used to remove deposited thin films from semiconductor processing chamber walls. One additional use of an RPS is to ionize and reduce the gaseous waste in a pump stream such that pumping is expedited by the plasma temperature and compound gases can be broken down to safer elemental form by the plasma ionization of the stream.

An RPS has been developed in which gases are introduced into a linear inductive plasma chamber, and the gases are dissociated into reactive species that flow out of the chamber and are used to perform work (e.g., on substrates) downstream of the source. In these types of RPS, an inductive coil is typically disposed axially about the chamber to inductively induce currents within the plasma.

Toroidal sources have also been developed in which currents are induced in a toroidal plasma contained within a general toroidal chamber. These Toroidal sources often use a ferrite based transformer arrangement to inductively couple fields produced by a primary set of windings, concentrate the fields in the ferrite core and then induce currents in the plasma which make up the secondary loop of the transformer.

These inductive linear and inductive toroidal remote sources have several drawbacks. For example, they typically only operate optimally when the plasma is in a high current state, which is referred to as an ICP state or sometimes as H-mode operation. This state typically cannot be produced without reaching a critical threshold of field strength and current density within the source. Consequently, low power, high pressure operation can be difficult and often not possible. Similarly, operation in the ICP regime requires adequate charge density in the plasma to be reached, and achieving this state during plasma ignition can be difficult. For this reason, these sources often require ignition to be accomplished using an easy-to-ionize gas, such as argon, before the processing gas can be introduced.

In addition, toroidal sources are traditionally designed from electrically and thermally conductive materials such as aluminum, which requires water cooling due to the high power densities that are required to operate these sources. To prevent current from flowing through the chamber body instead of through the plasma, the design of toroidal sources typically incorporates dielectric breaks in the body. These dielectric breaks experience a high voltage drop (i.e. a high electric field) in their proximity that results in ion acceleration to the walls of the source. This ion acceleration results in erosion of the wall in these locations resulting in damage to the inner walls and shortened operating lifetime of the device. This ionic bombardment of the wall also results in particle generation. Particle generation in these sources can be particularly damaging to thin film structures, semiconductor devices or to the downstream tools being cleaned by these remote sources.

Linear inductive sources see non-uniform field distribution since the field strength is greatest close to where the coils wrap around the linear source. The result is that portions of the inside of the source etch faster via ion bombardment and thus linear sources often have shortened lifetimes.

As seen, existing RPS sources are often unsatisfactory and improved RPS sources will almost certainly be needed in the future.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure may be characterized as a remote plasma source comprising a first electrode, a second electrode, a chamber, and an RF power source input. One of the first or second electrodes can at least partially surround the other electrode. The chamber can be at least partially enclosed by a chamber wall and configured for coupling to a processing chamber. The chamber wall can separate the first and second electrodes. Furthermore, the chamber can include a first path for the entry of a first fluid into the chamber and can further include a second path configured to provide a second fluid into the processing chamber. The second fluid can include at least a portion of disassociated fluid created from the first fluid. The RF power source input can be configured to couple to an RF power source and provide RF power from the RF power source to the first electrode. The RF power can electrostatically couple to the second electrode so as to electrostatically sustain a plasma within at least a portion of the chamber.

Other embodiments of the disclosure may also be characterized as a method of sustaining a plasma in a capacitively coupled remote plasma. The method can include passing RF power between two capacitively coupled electrodes separated by a chamber wall at least partially enclosing a chamber of the capacitively coupled remote plasma source. The method can also include sustaining a plasma within the chamber via the RF power being capacitively coupled to the plasma. The method further can include providing a first fluid into the chamber and dissociating at least a portion of the first fluid via interaction with the plasma. The method can further include passing a second fluid to a processing chamber coupled to the capacitively coupled remote plasma source, wherein the second fluid includes at least a portion of disassociated fluid created from the first fluid.

Other embodiments of the disclosure can be characterized as a non-transitory, tangible computer readable storage medium, encoded with processor readable instructions to perform a method for remotely sustaining a capacitively coupled plasma. The method can include passing RF power between two capacitively coupled electrodes separated by a chamber wall at least partially enclosing a chamber of the capacitively coupled remote plasma source. The method can also include sustaining a plasma within the chamber via the RF power being capacitively coupled to the plasma. The method further can include providing a first fluid into the chamber and dissociating at least a portion of the first fluid via interaction with the plasma. The method can further include passing a second fluid to a processing chamber coupled to the capacitively coupled remote plasma source, wherein the second fluid includes at least a portion of disassociated fluid created from the first fluid.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

The present disclosure relates generally to plasma processing. More specifically, but without limitation, the present disclosure relates to plasma processing via a capacitively-coupled remote plasma source.

Figure 1:
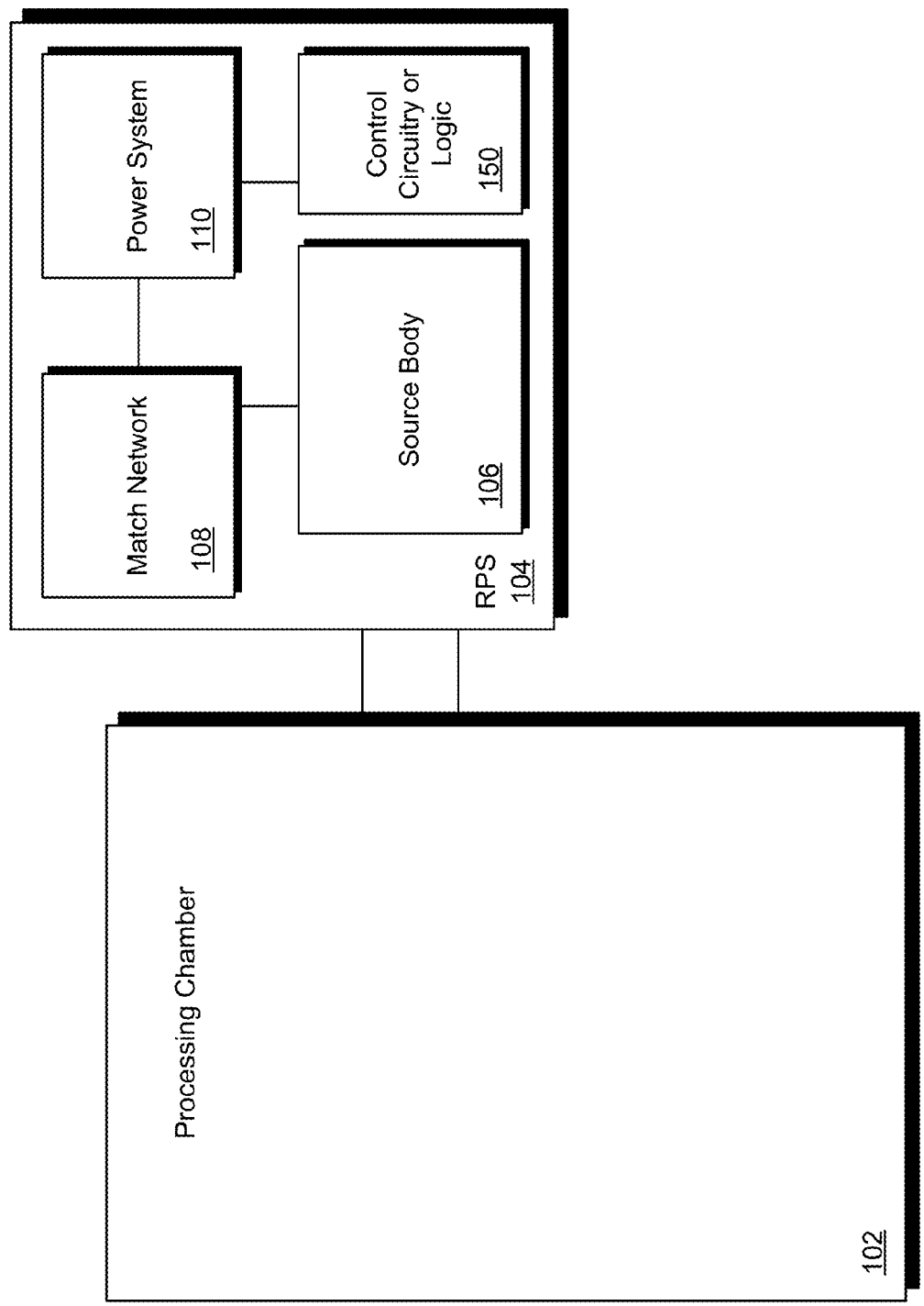
FIG. 1 is a block diagram depicting the environment in which several embodiments of the present invention may be realized.

Referring first to FIG. 1, shown is a block diagram depicting the environment in which several embodiments of the present invention may be realized. As shown a remote plasma source (RPS) 104, which generally operates to provide activated gases and free radicals to a processing chamber 102, operates as a functional component that is separate from the processing chamber 102. Disclosed herein are several inventive variations of the RPS 104 depicted in FIG. 1, which may include a power system 110, match network 108, and source body 106. Although the match network 108 and power system 110 are depicted as being integrated (e.g., within a same housing) with the source body 106, this is certainly not required, and in many implementations, the power system 110 and match network 108 may be separated from the source body 106.

The processing chamber 102 may be realized by a variety of different types of processing chambers that effectuate differing types of processes (e.g., etch and deposition processes). And depending upon the type of process that is carried out by the processing chamber 102, the RPS 104 may be used for a variety of purposes (e.g., cleaning polymer from a wafer after a dielectric etch process or cleaning the chamber 102 inner walls after a deposition process). These processes can be effectuated by introducing activated gases and/or free radicals from the source body 106 into the processing chamber 102.

The power system 110 can operate at a range of AC frequencies, for instance in the VHF range, as well as pulsed DC and other time-varying waveforms. The power, frequency, DC and/or AC bias, pulse width, and pulse modulation, along with other electrical characteristics of the power system 110 can be controlled via the control circuitry or logic 150, which can be embodied in hardware, software, firmware, or a combination of these. One skilled in the art will recognize that even though the control circuitry or logic 150 is not illustrated in other figures, it can still be used with any of the embodiments that will be discussed later in this disclosure. Sensors for detecting plasma density or field strength (e.g., within the processing chamber 102) can be in communication with the control circuitry or logic 150 such that the power system 110 operates as a feedback or feedforward system.

Figure 2:
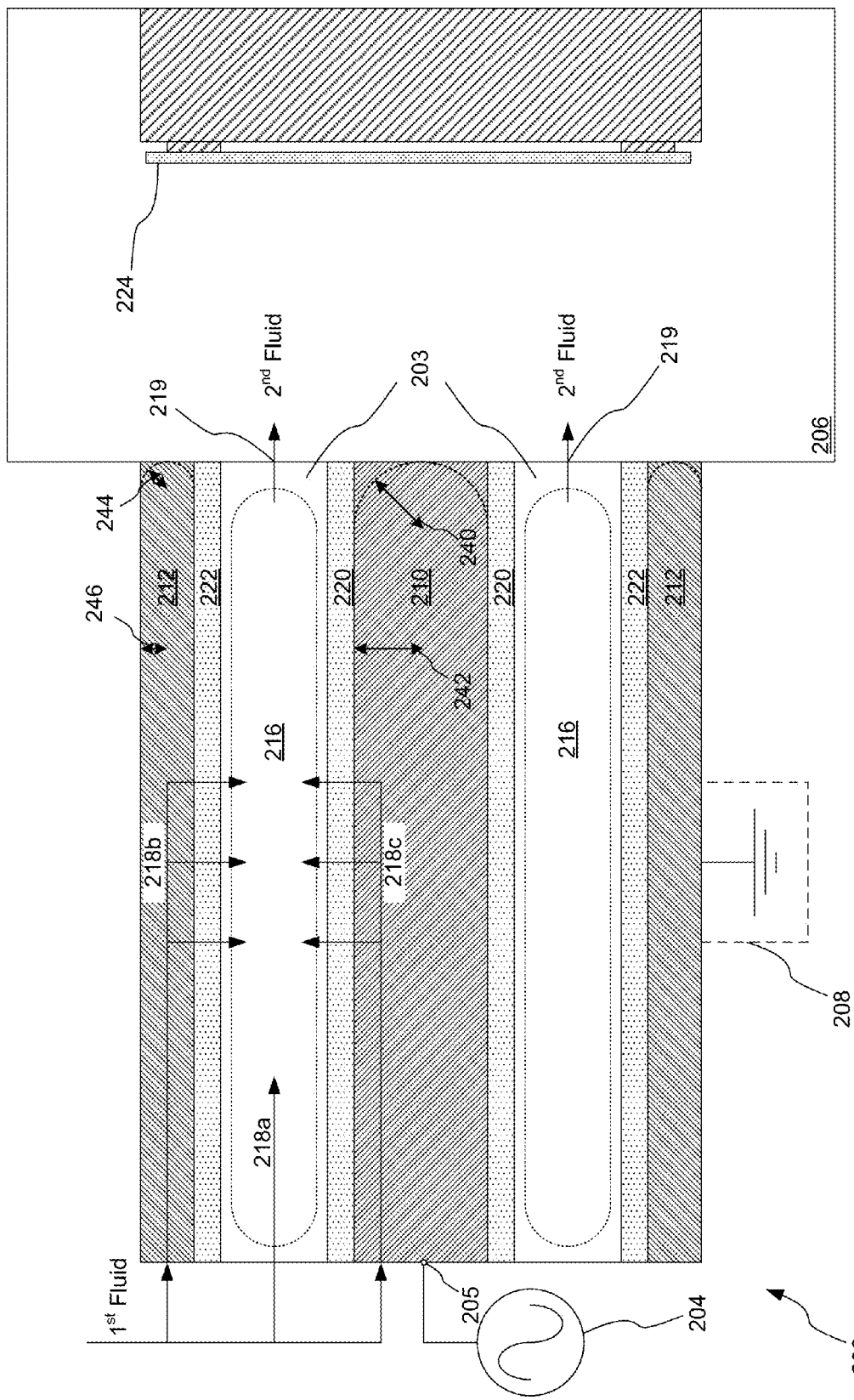
FIG. 2 illustrates a cross section of exemplary functional components of a remote plasma source (RPS).

FIG. 2 illustrates a cross section of exemplary functional components of an RPS. The RPS 202 includes an RPS chamber 203 at least partially enclosed by a chamber wall and configured to couple to a processing chamber 206. The chamber wall can separate a first electrode 210 and a second electrode 212, where the first electrode 210 is arranged within the RPS chamber 203. The second electrode 212 can also be said to at least partially oppose or at least partially surround (e.g., encircle) the first electrode 210. In some embodiments, the RPS chamber 203 wall is an inner surface of the second electrode 212. An RF power source 204 provides RF power (e.g., any time-varying power) to an RF power source input 205 and then to the first electrode 210 while the second electrode 212 is grounded, via optional grounding path 208, or floating. RF power is primarily electrostatically (capacitively) coupled to the second electrode 212 (some inductive coupling may also occur) and to a plasma 216 that is ignited and sustained within at least a portion of the RPS chamber 203.

The RPS 202 can include a first dielectric component 220 (e.g., ceramic) separating the first electrode 210 from the plasma 216 and DC isolating the first electrode 210 from the plasma 216 such that the plasma 216 and the first electrode 210 can operate at different potentials. The first dielectric component 220 can also be arranged so as to prevent the plasma 216 from interacting with the first electrode 210. The RPS 202 can also include a second dielectric component 222 (e.g., ceramic) separating the second electrode 212 from the plasma 216 and DC isolating the second electrode 212 from the plasma 216 such that the plasma 216 and the second electrode 212 can operation at different potentials. The second dielectric component 222 can also be arranged so as to prevent the plasma 216 from interacting with the second electrode 212.

At sufficient power densities, or when the electromagnetic field strength between the two electrodes 210, 212 is high enough, fluid (gas, liquid, or combination of the two) between the first and second dielectric components 220, 222 ionizes and forms the plasma 216. Fluids are a subset of the phases of matter and include gases (of any viscosity), liquids, and plasmas. The same RF power that ignites the plasma 216 can also capacitively sustain the plasma 216. A first fluid (gas, liquid, or a combination of the two), such as a non-activated gas, can be passed into the RPS 202 via a first path such as an axial entry path 218a, inward-facing radial entry path 218b, or outward-facing radial entry path 218c. The first path enables the first fluid to pass into the chamber 203 and interact with the plasma 216 at an optimal position (e.g., an area of greatest plasma 216 density; an area between the first and second electrodes 210, 212; an area where there is the greatest fluid-plasma interaction). The first fluid can interact with the plasma 216, dissociate to form a second fluid (gas, liquid, or combination of the two), such as an activated gas and/or free radicals, and be passed to the processing chamber 206 via a second path. The second fluid can include at least a portion of dissociated fluid generated from the first fluid. The second path can be implemented as, for instance, one or more exit paths 219.

For purposes of this disclosure, a plasma is sustained by maintaining a desired plasma density (also known as electron or ion density), or by maintaining a rate of ionization that exceeds the rate of electron-ion recombination by a desired value. In an embodiment, a plasma is sustained when there is a plasma density of $10^8$ to $10^{13}$ free electrons per $cm^3$.

As the gas passes through the plasma 216 it disassociates to form an activated gas and/or free radicals that can be provided to a processing chamber 206 in fluid communication with the RPS 202. The activated gas and/or free radicals can interact with surfaces within the processing chamber 206 (e.g., chamber walls or a chuck-mounted wafer 224) to carry out various processes such as cleaning and etching.

The dielectric components 220, 222 can take a variety of forms. For instance, the dielectric components 220, 222 can be chemical layers or a barrier fabricated onto the electrodes 210, 212 (e.g., via epitaxial growth, oxidization, spray coating). They can also be structures that are separate from but attached to the electrodes 210, 212 for instance via connecting flanges (not illustrated). In some embodiments, the dielectric components 220, 222 can be coupled to each other, however, they are typically DC isolated from each other.

The electrodes 210, 212 and the dielectric components 220, 222 can take a variety of shapes that all involve the outer components (second electrode 212 and second dielectric component 222) encircling the inner components (first electrode 210 and first dielectric component 220). In one instance, the RPS 202 can have a tubular or cylindrical shape. In other words, when viewed from the perspective of the wafer 224, the RPS 202 appears as a set of rings with the first electrode 210 in the center and the second electrode 212 forming an outer ring. In another embodiment, a rectangle having beveled edges can be used (appearing to the wafer 224 as a set of squares with beveled corners). While these components can be coaxially aligned (e.g., concentric), in some embodiments the two electrodes need not share an identical axis (need not be concentric).

Figure 8:
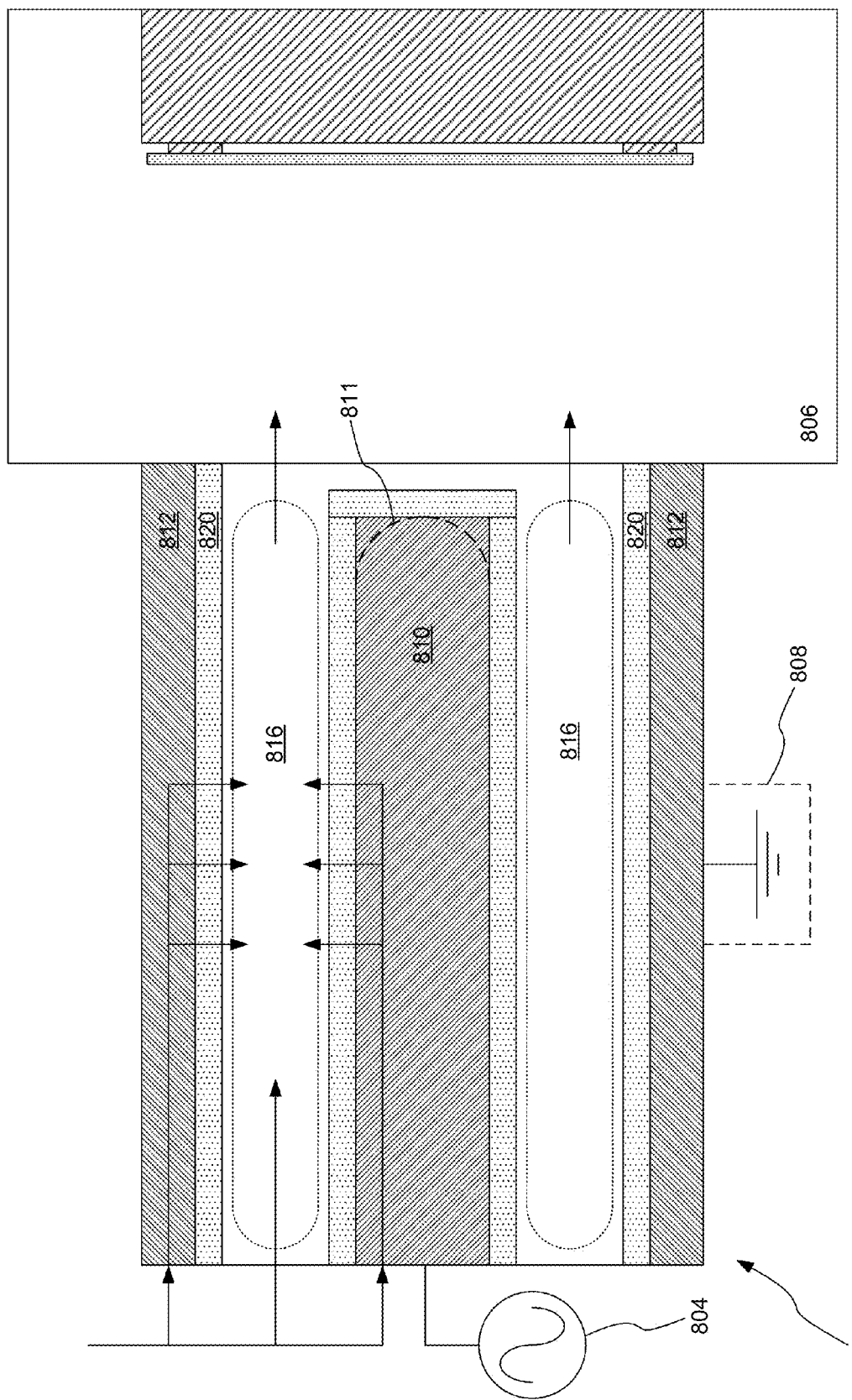
FIG. 8 illustrates yet another embodiment of an RPS.

While the first and second electrodes 210, 212 are illustrated as having sharp edges, for instance where the first electrode 210 meets the processing chamber 206, in many embodiments these sharp edges can be beveled or curved (see, for example, element 811 in FIG. 8). This is because, sharp edges on a conductor tend to increase electromagnetic field density near those edges or corners, and this leads to a non-uniform field density in the RPS 202. Non-uniform field density leads to 'hot spots' or parts of the RPS 202 that see greater ion bombardment from the plasma 216 and thus erode faster than other portions of the RPS 202. By curving edges of the electrodes 210, 212 and thus establishing more uniform field densities, the RPS 202 does not see hot spots and sees an increased lifetime before replacement is required. In one embodiment, a radius of curvature 240 for edges of the first electrode 210 is substantially equal to a radius 242 of the first electrode, and a radius of curvature 244 for edges of the second electrode 212 is substantially equal to a radius 246 of the second electrode 212.

The axial path 218a and the inward-facing and outward-facing radial paths 218b, 218c, respectively, illustrate relative directions of flow for the first fluid rather than an absolute direction, placement, number, or configuration of the first path. In some embodiments, the first path can include openings in the electrodes 210, 212, the dielectric components 220, 222, and/or the RPS 202 enabling the first fluid (e.g., a pressurized non-activated gas) to enter the RPS 202 and interact with the plasma 216. In some embodiments, the first fluid can include multiple fluids that pass through different paths into the chamber 203. As such, multiple fluids can interact with different portions of the plasma 216.

While the paths 218a, 218b, 218c are illustrated as only entering an upper half of the RPS 202, the omission of path indicators on the lower half of the RPS 202 was merely to simplify the figure. One of skill in the art will recognize that the paths 218a, 218b, 218c can be arranged around the entire RPS 202 such that the first fluid is equally distributed through the plasma 216. On the other hand, in some embodiments, the paths 218a, 218b, 218c can be arranged such that the first fluid is disbursed into the RPS chamber 203 in a non-uniform way. For instance, the first fluid can be disbursed radially around a center of the RPS chamber 203 while not being disbursed near ends of the RPS chamber 203.

In some embodiments, the first fluid can include one or more fluids such as gases, liquids, or combinations of the two. The second fluid can also include one or more fluids such as gases, liquids, or combinations of the two. In some instances, some or all of the first and second fluids can be the same fluids. For instance, a non-activated gas may enter the chamber 203 as the first fluid and partially disassociate in the plasma 216 to form activated gas and/or free radicals. These can be passed to the processing chamber 206 along with some of the first fluid (e.g., non-activated gas) as a second fluid where the second fluid comprises some of the first fluid and some activated gas and/or free radicals.

The plasma 216 boundary is designated by a dotted line since this boundary position varies depending on its definition, and is not necessarily drawn to scale. The plasma 216 boundary could be defined as a plasma density selected from the range $10^8$ to $10^{13}$ free electrons per $cm^3$. In other words, there may be at least $10^8$ to $10^{13}$ free electrons per $cm^3$ at all locations within the plasma 216 boundary.

In many implementations, the power source 204 is realized by a VHF power source (e.g., substantially higher than 13.6 MHz) providing alternating voltage that ignites and sustains the plasma 216. It has been found that operating at relatively high frequencies (e.g., substantially higher than 13.6 MHz) enables a voltage that is applied to the first electrode 210 to be reduced, which may improve power efficiency and reduce RPS chamber 203 wall erosion. A range of frequencies may be utilized (including for example but not by way of limitation 60 MHz) and as discussed further herein, more than one power source 204 may also be utilized to apply power to the first electrode 210. For example, it has been found that applying additional power with an additional power source (not illustrated) (e.g., 2 MHz power supply) to the first electrode 210 produces a modified plasma 216 density distribution that may be more desirable than instances where a single source or frequency is applied to the first electrode 210.

While the power source will sometimes be illustrated as supplying RF power to an electrode that at least partially opposes or at least partially surrounds (e.g., encircles) a non-powered electrode (FIGS. 3, 5, 7, 9) in other instances, coupling the power source to the inner electrode may be preferable (e.g., FIGS. 2, 4, 6, 8) in order to avoid human contact with the powered or non-grounded or non-floating electrode. In other words, when RF power is supplied to the inner electrode, human contact with high voltage is less likely.

The plasma 216 can be ignited and sustained within a portion of, or within the entire, RPS chamber 203. In some embodiments, the plasma 216 can even be sustained outside of the RPS 202, for instance, where the plasma 216 expands into the processing chamber 206.

The RPS 202 herein disclosed has a number of advantages when compared to linear and toroidal sources. First is the longevity of the RPS 202 made possible by avoiding 'hot spots' and achieving a more uniform distribution of fields within the RPS chamber 203. This entails maintaining uniform field and power densities within the RPS chamber 203. Use of curved edges on the electrodes 210, 212 as discussed earlier, is one way to enhance field and power uniformity. Second, is reduced ion bombardment as enabled by a floating plasma 216 potential relative to at least one of the electrodes 210, 212. The dielectric components 220, 222 create DC isolation between the plasma 216 and either or both electrodes 210, 212, thus enabling the plasma 216 potential to float relative to one or both of the electrodes 210, 212. By floating the plasma 216 potential, there is a lower sheath voltage and thus less damaging ion bombardment to the RPS chamber 203 walls. Lower chamber 203 damage is also enabled by lower local power (e.g., the same power is input into the system, but local high power regions are less-severe than in the art). In other words, the electrostatic RPS 202 can sustain the same plasma 216 density as inductively-coupled sources, but with less chamber 203 wall damage. One other way to describe this advantage is that by isolating the DC potential (which manifests as sheath potential) from the RF potential, more energy can be directed to the plasma 216 density rather than into stronger sheath voltages and thus shorter chamber 203 lifetimes.

The one or more dielectric components 220, 222 also reduce activated gas and free radical interaction with the chamber 203 walls as well as plasma 216 contamination. Plasma 216 contamination can be caused in the prior art where plasma sputters metal chamber walls releasing contaminants into the plasma. One cause of chamber sputtering in the art are ground arcs, where current flows at the surface of a chamber wall between two grounded potentials. The one or more dielectric components 220, 222 can help avoid ground arcs.

The arrangement of the electrodes 210, 212 also enables non-activated gas to enter the plasma 216 at positions and angles not possible in the art. For instance, toroidal and linear inductive sources are unable to provide an outward-facing radial path 218c as is possible with the RPS 202. The introduction of the first electrode 210 provides a new route and placement for the passage of fluids as well as other functions such as cooling.

Another advantage of the RPS 202 is the avoidance of a transformer as is often required in inductively coupled sources. The RPS 202 can also typically operate at higher frequencies (e.g., >30 MHz, >160 MHz) than sources in the art. At these higher frequencies, voltages used to ignite and sustain the plasma 216 are lower, which leads to less chamber wall damage due to ion bombardment. In other words, for the capacitive RPS 202 at higher frequencies, a greater percentage of power goes into increased plasma 216 density rather than sheath voltage. This same advantage does not occur with inductive sources, and instead increased frequency merely adds greater power to the sheath voltage and thus greater chamber erosion.

The capacitively coupled RPS 202 operating at higher frequencies (e.g., >30 MHz) enables the RPS 202 to have wider ignition and operating ranges than sources in the art (e.g., wider range of acceptable parameters for pressure, flow, power, and/or frequency). For instance, the RPS 202 can operate at the same pressure as prior art sources, but at lower power, which can be advantageous in low power processing applications. Prior art sources typically cannot sustain a plasma at the same power and pressure as the RPS 202.

The capacitively coupled RPS 202 also has a smaller footprint than shower-head-type in-situ sources, and has a similar footprint to inductive sources. However, the same RPS 202 footprint can be used for a variety of processing chamber 206 sizes (e.g., where the processing chamber 206 is increased to accommodate larger wafers), while inductive remote sources and showerhead in-situ sources typically increase in size to accommodate a larger processing chamber. The RPS 202 is also externally mounted to the processing chamber 206, which can be advantageous for installation and maintenance.

The RPS 202 also enables a rack-mounted VHF power source 204 and integrated match network circuitry (either fixed or selectable). The RPS 202 also can carry out sweep frequency impedance matching and can include integrated ignition circuitry. This advantageously compares to inductive remote sources that often have separate ignition and operating procedures and circuitry.

Coatings and dielectrics within inductive sources are typically optimized to maximize coupling efficiency to the plasma (e.g., via thinner dielectric layers). In contrast, the RPS 202 does not see reduced coupling when the dielectric components 220, 222 see modifications to the material type or thickness. This allows the dielectric components 220, 222 to be modified in order to better produce a certain processing outcome without degrading coupling efficiency.

Operating power for the RPS 202 can include, but is not limited to, the range 100-7000 Watts, and pressure ranges from 10 mTorr to over 200 Torr. The plasma 216 density can include the range $10^{11}$-$10^{12}$/cm$^3$ and the plasma 216 can, and in an embodiment, can be allowed to expand beyond or to be projected beyond the RPS source chamber 203 and into the processing chamber 206 (also known as a remote projected plasma source). The plasma 216 density can be a measure of the bulk of the plasma 216, for instance as an average across a main discharge region. The main discharge region can include at least a portion of the chamber 203, and in some embodiments can expand into the processing chamber 206.

Another advantage of RPS 202 is that since one of the electrodes 210, 212 can be grounded or floating, the wafer 224 need not be grounded thus enabling unique processing (e.g., making nitride surfaces, low-energy etching, or surface modification). In other words, using the RPS 202, the wafer 224 can float or be biased at any desired potential (it need not be part of the RF circuit). This alleviates grounding concerns and VHF chamber 203 compatibility, yet enables VHF plasma treatment of the wafer 224. This technology is also backward compatible and can thus be used with older processing chambers 206 without modification.

Although a wafer 224 is herein illustrated and described, one of skill in the art will recognize that various other processing targets can be substituted for the wafer 224. For instance, sheets of glass (e.g., for LCD, LED, and plasma television production) can be processed in the processing chamber 206.

The components depicted in FIG. 2 are intended to convey functional components associated with many embodiments—a few of which are discussed further herein. The depiction of these components in FIG. 2 is not intended to be a mechanical or electrical hardware diagram; thus the depicted components may be rearranged and modified while still providing the same functionality. Moreover, some components may be combined or removed, and additional components may be added in various implementations. For example, the geometrical aspects and relative positioning of the electrodes 210, 212 may vary substantially from embodiment to embodiment. Also, the power source 204 is illustrated without a match network (e.g., 108 in FIG. 1). However, one of skill in the art will recognize that the power source 204 can be assumed to include impedance matching circuitry. While the power source 204 is coupled to the first electrode 210, the power source 204 can alternatively be coupled to the second electrode 212 and the first electrode 210 can be grounded or floating (see FIG. 3). Although two dielectric components 220, 222 are shown, in some embodiments, only a single dielectric component is used (see FIGS. 4-7). Three entry paths 218a, 218b, 218c are illustrated, yet in practice only one or more of these paths can be used. The electrodes 210, 212 are illustrated as having the same length, yet in some embodiments, the electrode receiving RF power from the power source 204 (the powered electrode) is shorter than the grounded or floating electrode (see FIGS. 8-9).

Figure 3:
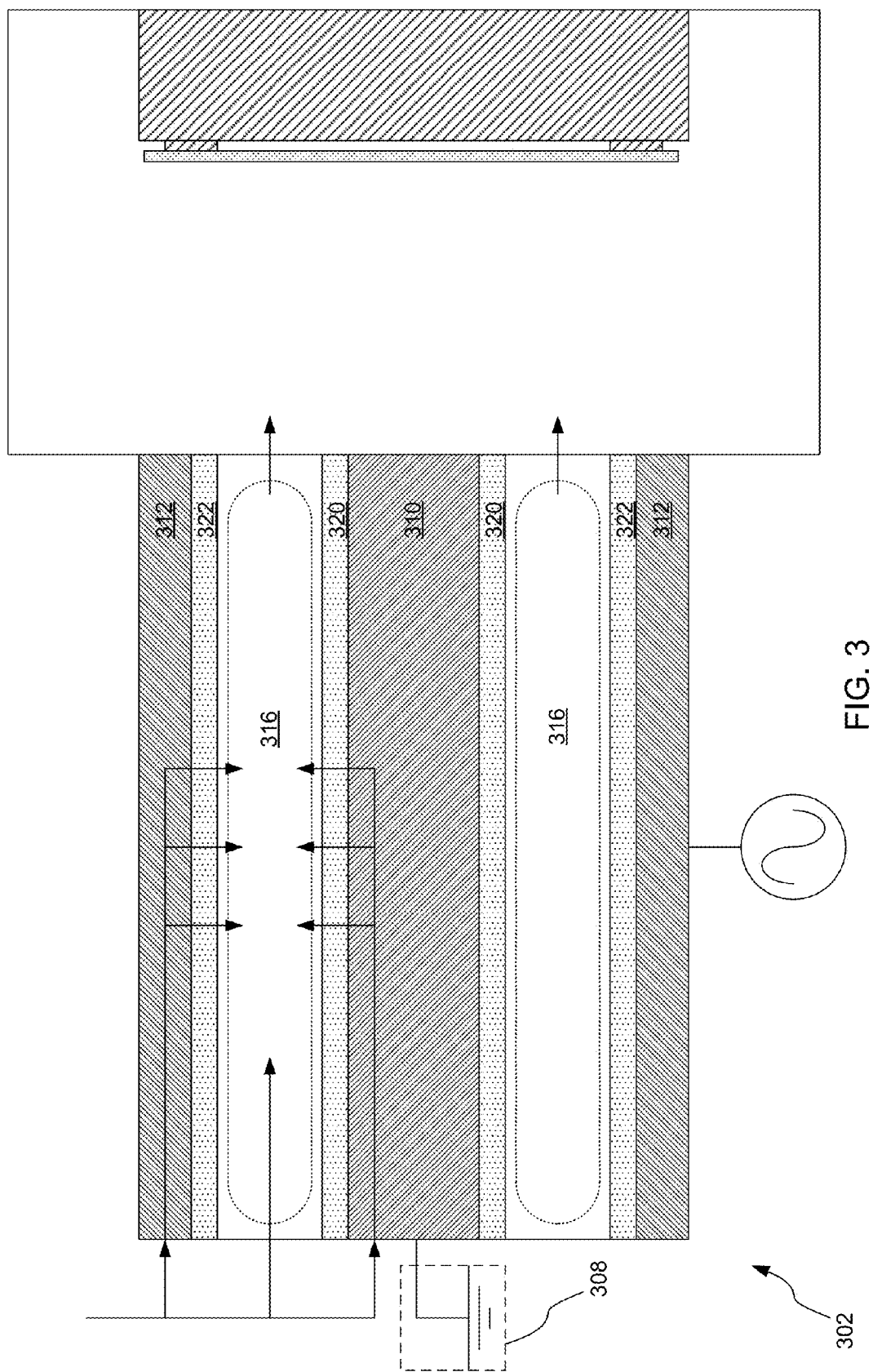
FIG. 3 illustrates another embodiment of an RPS.

FIG. 3 illustrates an embodiment of an RPS 302 where RF power is provided to an outer electrode 312 that at least partially surrounds an inner electrode 310, where the inner electrode 310 is grounded via an optional grounding connection 308 or can be electrically floating. The RPS 302 also includes a first dielectric component 320 separating the inner electrode 310 from the plasma 316. The RPS 302 further includes a second dielectric component 322 separating the outer electrode 312 from the plasma 316.

Figure 4:
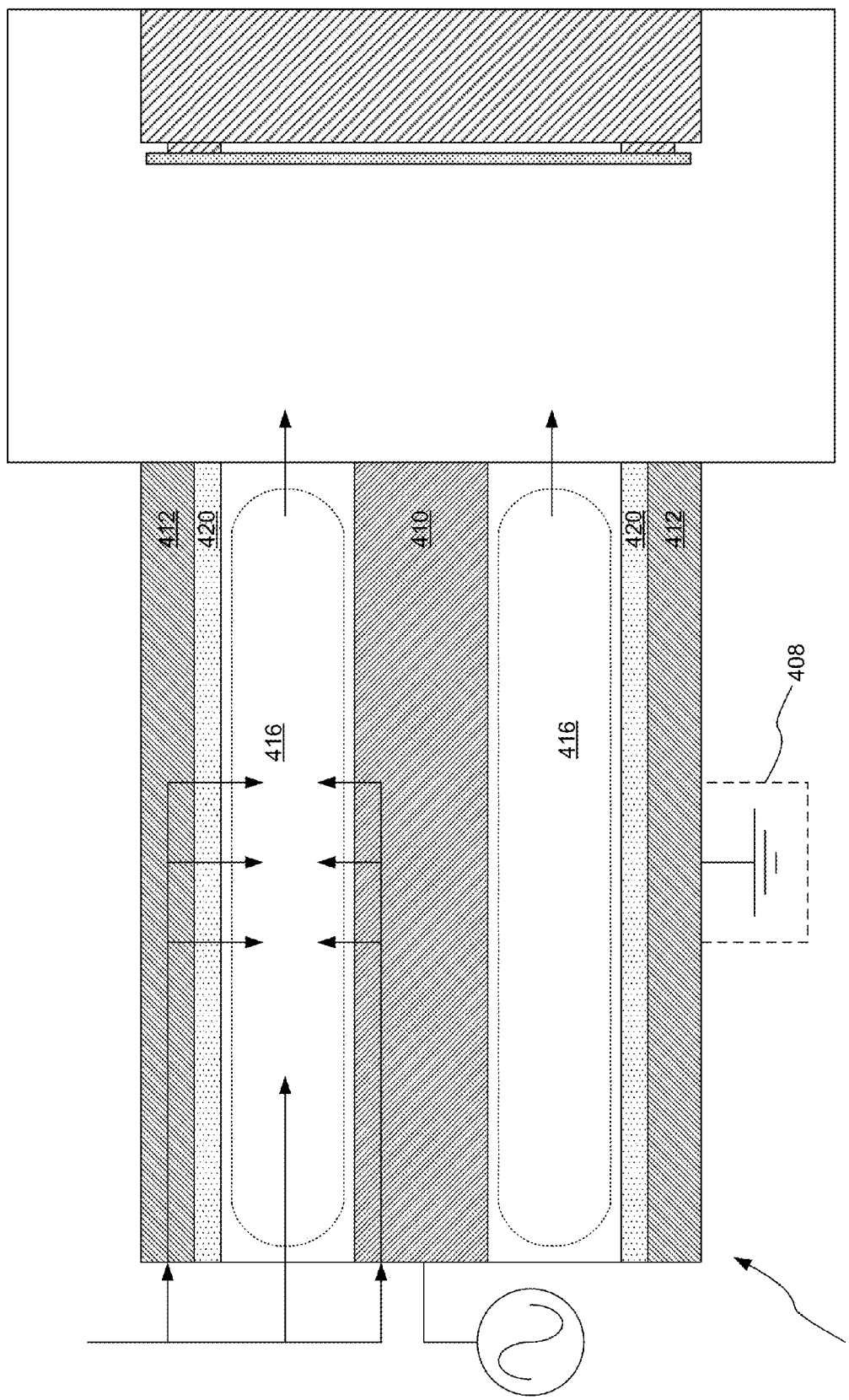
FIG. 4 illustrates another embodiment of an RPS.

FIG. 4 illustrates an embodiment of an RPS 402 where RF power is provided to an inner electrode 410 at least partially surrounded by an outer electrode 412, where the outer electrode 412 is grounded via an optional grounding connection 408 or can be electrically floating. The RPS 402 also includes a first dielectric component 420 separating the outer electrode 412 from the plasma 416.

Figure 5:
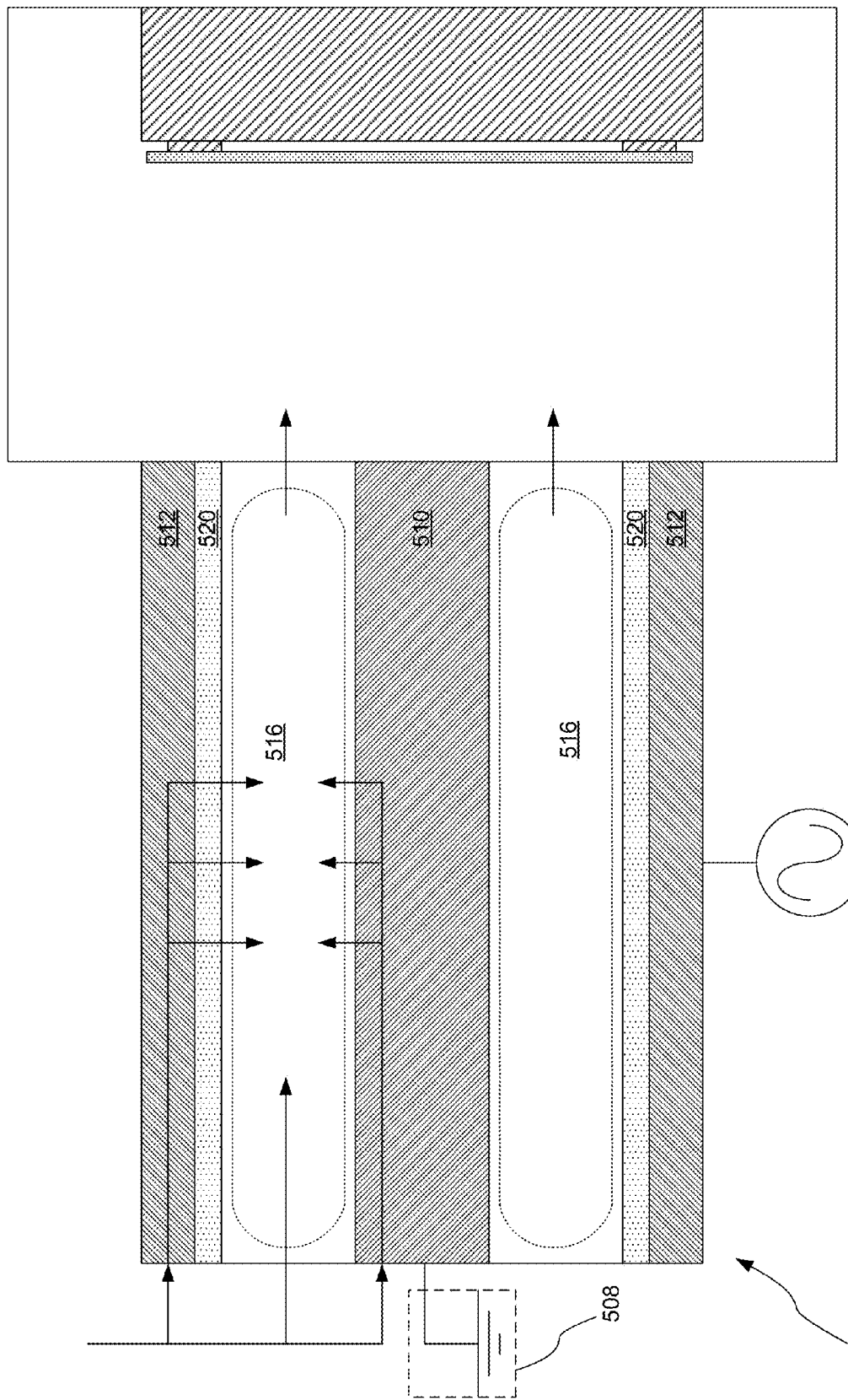
FIG. 5 illustrates yet another embodiment of an RPS.

FIG. 5 illustrates an embodiment of an RPS 502 where RF power is provided to an outer electrode 512 encircling an inner electrode 510, where the inner electrode 510 is grounded via an optional grounding connection 508 or can be electrically floating. The RPS 502 also includes a first dielectric component 520 separating the outer electrode 512 from the plasma 516.

Figure 6:
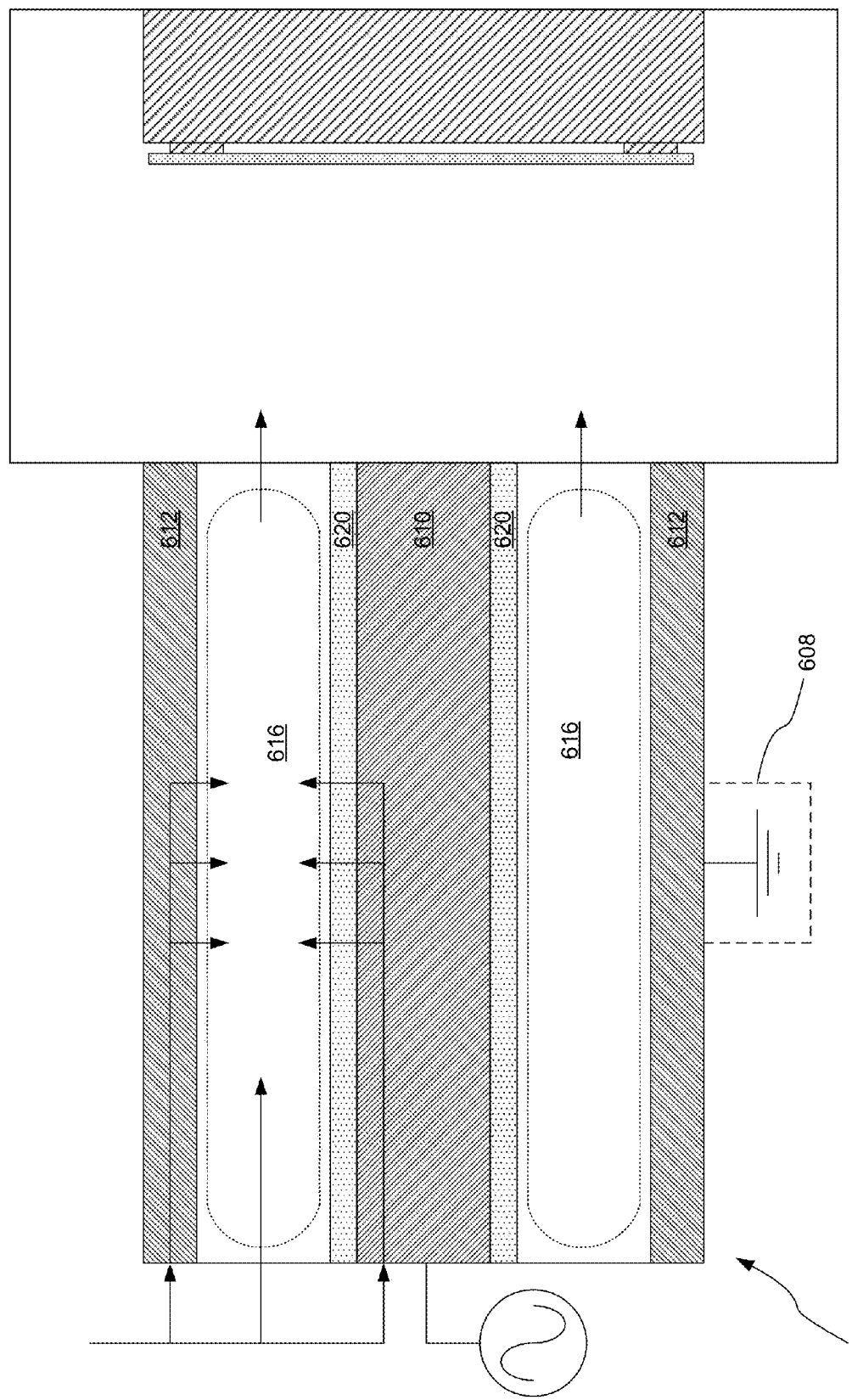
FIG. 6 illustrates yet another embodiment of an RPS.

FIG. 6 illustrates an embodiment of an RPS 602 where RF power is provided to an inner electrode 610 at least partially surrounded by an outer electrode 612, where the outer electrode 612 is grounded via an optional grounding connection 608 or can be electrically floating. The RPS 602 also includes a first dielectric component 620 separating the inner electrode 610 from the plasma 616.

Figure 7:
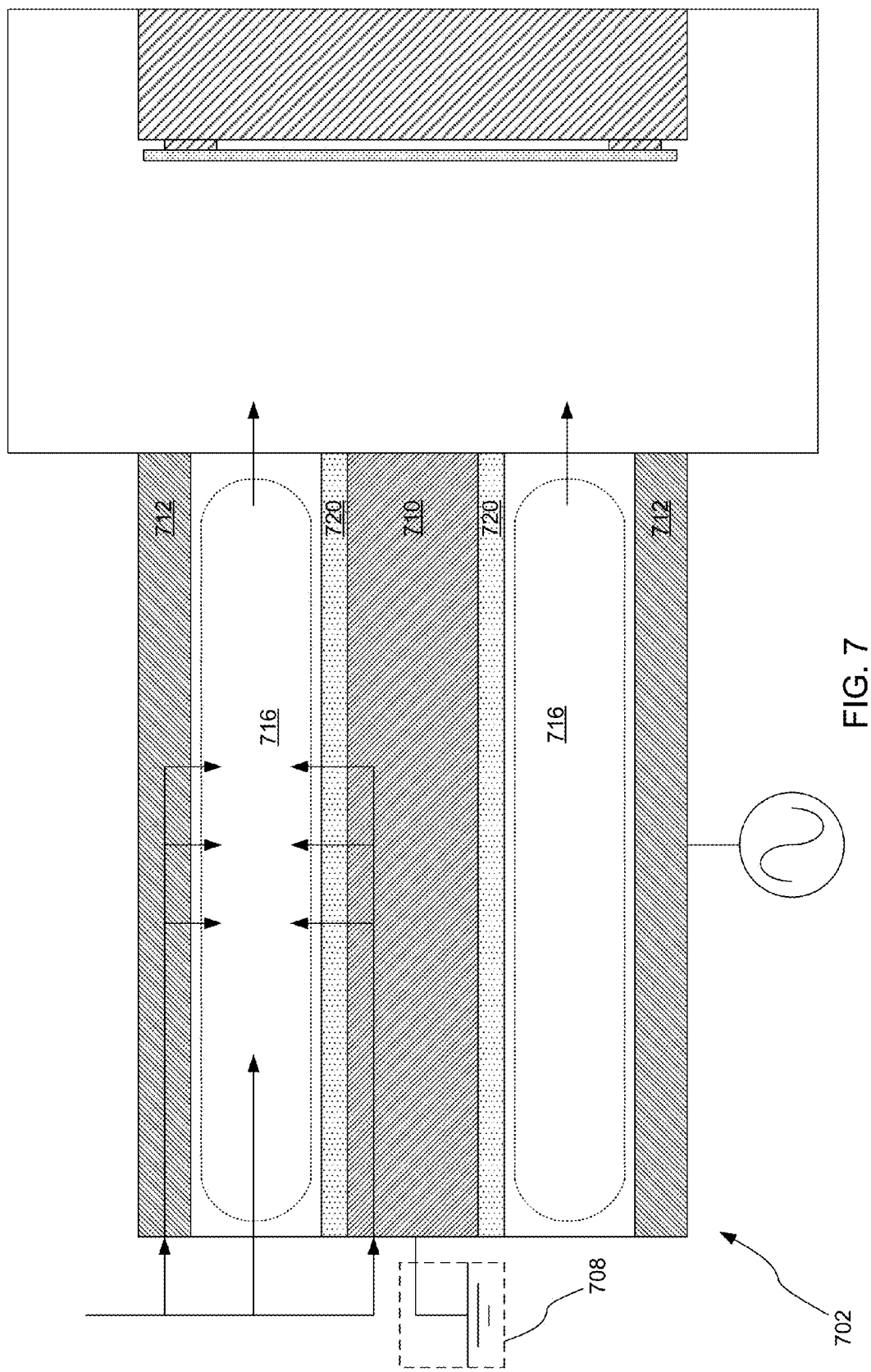
FIG. 7 illustrates yet another embodiment of an RPS.

FIG. 7 illustrates an embodiment of an RPS 702 where RF power is provided to an outer electrode 712 encircling an inner electrode 710, where the inner electrode 710 is grounded via an optional grounding connection 708 or can be electrically floating. The RPS 702 also includes a first dielectric component 720 separating the inner electrode 710 and the plasma 716.

FIG. 8 illustrates an embodiment of an RPS 802 where RF power is provided to a first electrode 810 (inner electrode) at least partially surrounded by a second electrode 812 (outer electrode). The second electrode 812 is grounded via optional grounding connection 808 or can be electrically floating. The RPS 802 also includes a first dielectric component 820 separating the first electrode 810 from the plasma 816, and a second dielectric component 822 separating the second electrode 812 from the plasma 816. The first electrode 810 is shorter (less elongated) than the second electrode 812. In other words, the electrode that is powered via a power source 804 (the powered electrode) is shorter than the non-powered (grounded or floating) electrode. Along these same lines, the first dielectric component 820 wraps around a front of the first electrode 810—in other words, providing a dielectric barrier between all portions of the first electrode 810 and the plasma 816.

The first electrode 810 is less elongated than the second electrode 812. For instance, the first electrode 810 can be 90%, 80%, 50%, or 25% the length of the second electrode 812, to name a few examples. In some instances, the first electrode 810 can have a length that is shorter than its diameter or radius. In such cases, the plasma 816 is shaped more like a tube rather than enclosing the first electrode 810.

As illustrated, the first electrode 810 has sharp edges proximal to a processing chamber 806. However, in other embodiments, these edges can be curved or beveled (as indicated by the dotted line 811), and in particular can be curved so as to have a radius substantially equal to half a diameter of the first electrode 810.

Figure 9:
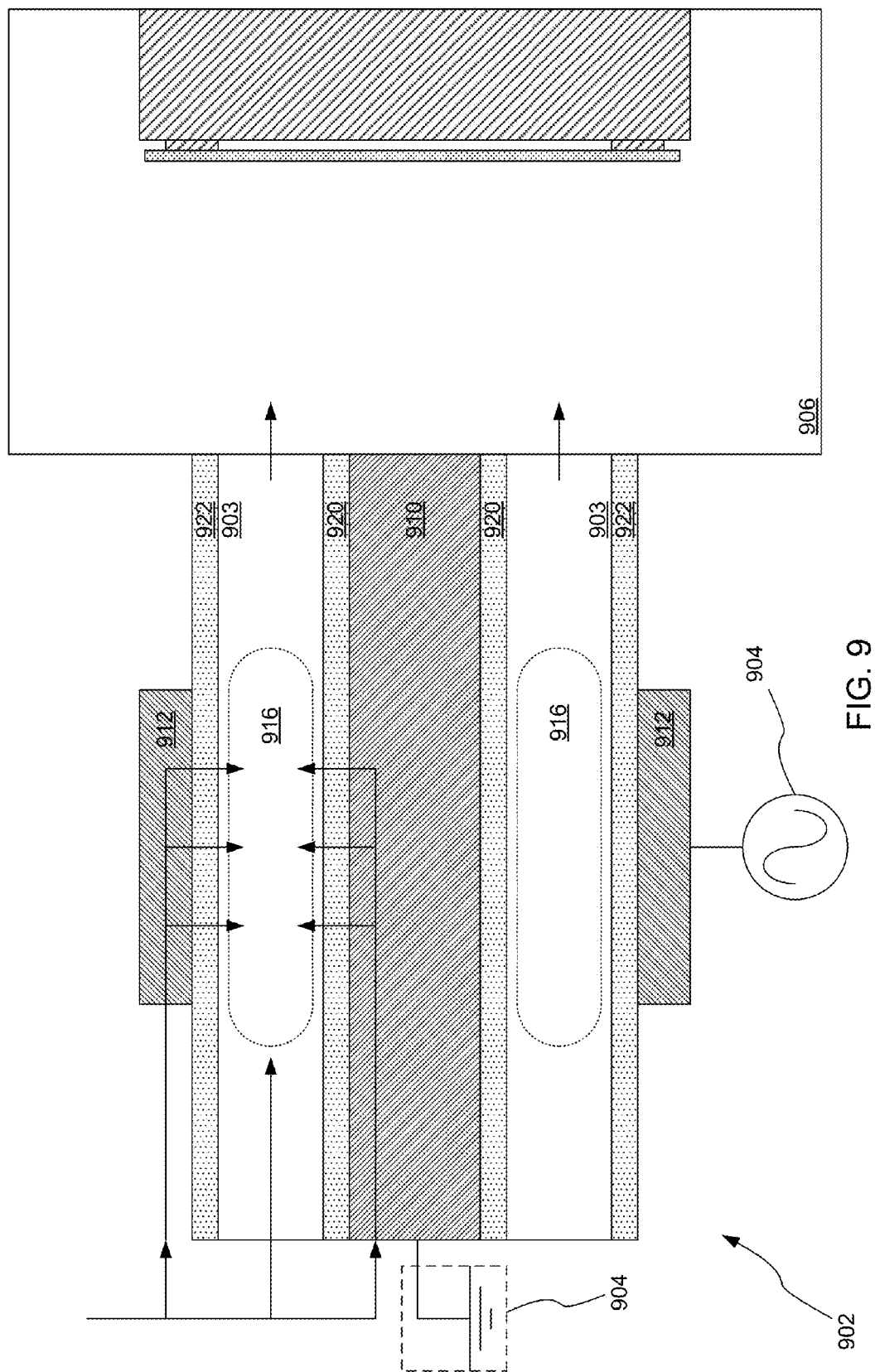
FIG. 9 illustrates yet another embodiment of an RPS.

FIG. 9 illustrates an embodiment of an RPS 902 where RF power is provided to a second electrode 912 (outer electrode) encircling a first electrode 910 (inner electrode). The inner electrode 910 is grounded via optional grounding connection 908 or can be electrically floating. The RPS 902 also includes a first dielectric component 920 separating the first electrode 910 from the plasma 916, and a second dielectric component 922 separating the second electrode 912 from the plasma 916. The second electrode 912 is shorter (less elongated) than the first electrode 910. In other words, the electrode that is powered via a power source 904 (powered electrode) is shorter than the non-powered (grounded or floating) electrode. The first and second dielectric components 920, 922 are illustrated as having equivalent lengths, although in some embodiments these lengths need not be equal.

The RPS 902 includes a chamber 903 that can be at least partially enclosed by the first and second dielectric components 920, 922. The plasma 916 can be confined within a portion of the chamber 903 surrounded by the second electrode 912. Part of the plasma 916 can expand beyond the confines of the second electrode 912, but does not typically extend the length of the chamber 903 or into the processing chamber 906, for instance.

Confinement is typically as illustrated—the plasma 916 is confined to a region of the RPS chamber 903 where the electrodes 910, 912 overlap. For instance, the plasma 916 of FIG. 9 is primarily confined to that region of the RPS chamber 903 where the second electrode 912 overlaps the longer first electrode 910.

In the various embodiments described above where the inner electrode is grounded, the RPS has an additional benefit; non-activated gas entering via an outward-facing radial entry path need not cross a potential difference at the introduction point (e.g., between the powered electrode and the chamber).

In all illustrated embodiments a radial distance between the first and second electrode is small enough that current primarily passes between the electrodes via the plasma. In other words, the region between the electrodes (e.g., chamber 203) can be the preferred current path in a low power mode of operation. As the power or pressure is increased, or various plasma characteristics are altered, any other conductor or electrode at any potential can act as a tertiary electrode and can be used to create or expand an "expansion zone" for the plasma between the electrodes and this third electrode. For instance, a pumping plenum or walls of the chamber can be grounded and thus act as a third electrode where the plasma expands towards this third electrode. By allowing the plasma to expand outside of a region of high field strength, various advantages can be achieved. For one, activated gases and free radicals can be formed in a plasma in an expansion zone, where there are lower field strengths, that otherwise are difficult or impossible to form in a typical plasma region. For another, plasma in an expansion zone can be used to filter or remove unwanted activated gases and free radicals, for instance where different species have different lifetimes. The expansion zone also expands the volume through which the RF power is applies thus lowering local power densities and simplifying cooling solutions.

While the electrodes in this disclosure have often been described as a first and second electrode and illustrated where the first electrode is at least partially surrounded by the second electrode, these arrangements can be flipped such that the first electrode at least partially surrounds the second electrode.

Figure 10:
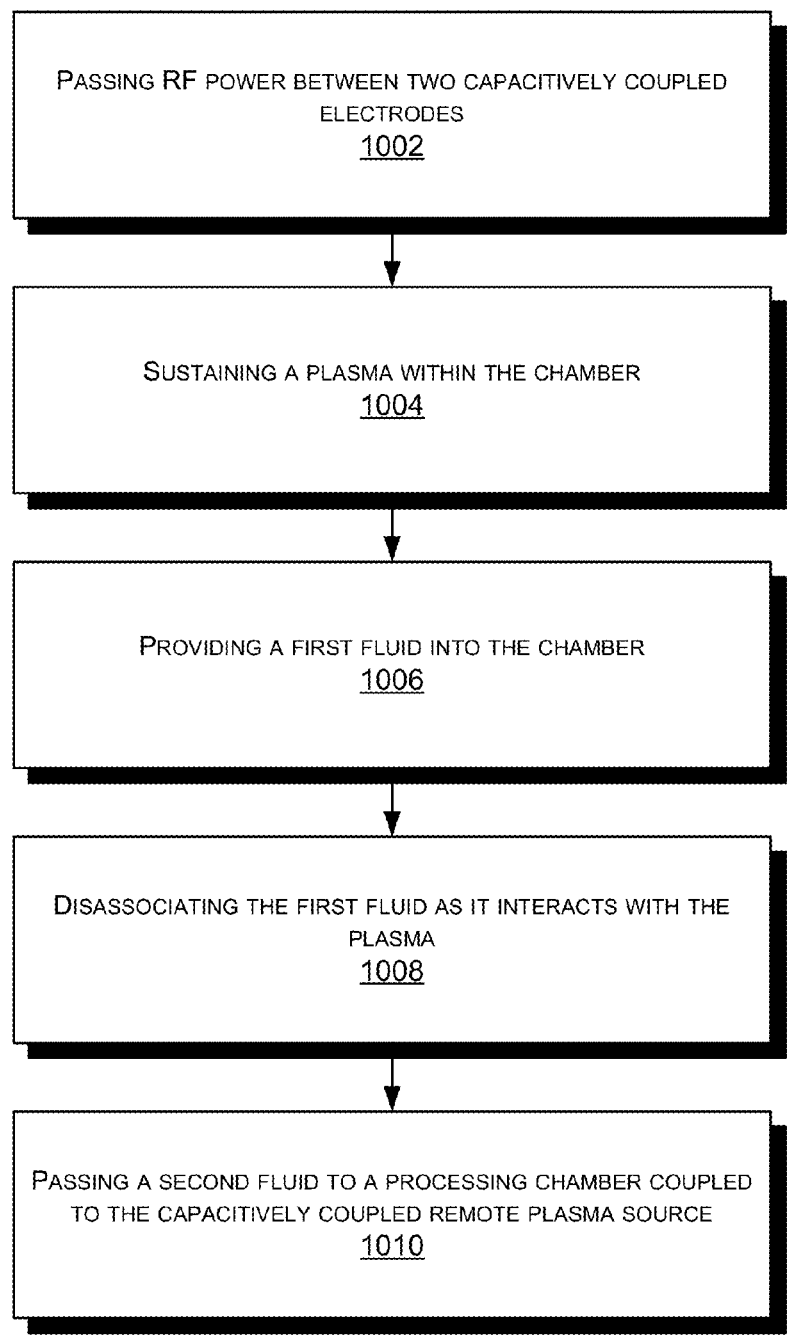
FIG. 10 illustrates yet another embodiment of an RPS.

FIG. 10 illustrates a method of sustaining a plasma in a capacitively coupled remote plasma source. This method will be described with parenthetical references to figure elements of FIG. 2. The method includes passing an RF power between two capacitively coupled electrodes (e.g., 210 and 212) in a first passing operation 1002. The electrodes can be separated by a chamber wall defining a chamber (e.g., 203) of the capacitively coupled remote plasma source. The method further comprises sustaining a plasma (e.g., 216) within the chamber in a sustaining operation 1004. The plasma can be sustained via the RF power being capacitively coupled to the plasma. A first fluid can be provided into the chamber via a providing operation 1006 (e.g., radially or axially). As the first fluid interacts with the plasma at least a portion of the first fluid can be disassociated in a dissociation operation 1008 to form activated gas and/or free radicals. A second fluid, comprising the activated gas and/or free radicals and sometimes a portion of the first fluid, can then pass to a processing chamber coupled to the capacitively coupled remote plasma source in a second passing operation 1010.

Figure 11:
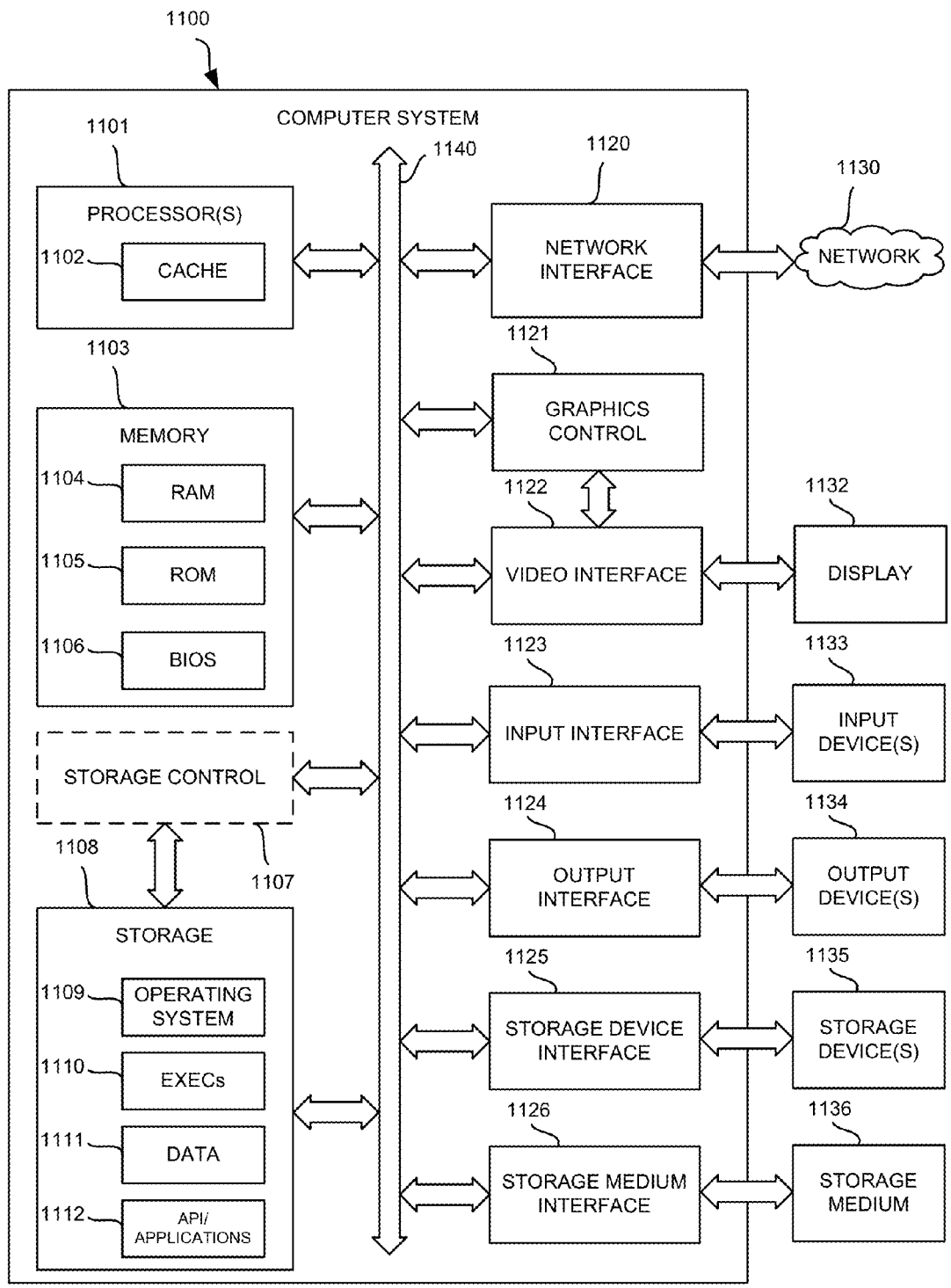
FIG. 11 illustrates a diagrammatic representation of one embodiment of a machine in the exemplary form of a computer system within which a set of instructions can execute for causing a device to perform or execute any one or more of the aspects and/or methodologies of the present disclosure

The systems and methods described herein can be implemented in a machine such as a computer system in addition to the specific physical devices described herein. FIG. 11 shows a diagrammatic representation of one embodiment of a machine in the exemplary form of a computer system 1100 within which a set of instructions can execute for causing a device to perform or execute any one or more of the aspects and/or methodologies of the present disclosure. The components in FIG. 11 are examples only and do not limit the scope of use or functionality of any hardware, software, embedded logic component, or a combination of two or more such components implementing particular embodiments.

Computer system 1100 may include a processor 1101, a memory 1103, and a storage 1108 that communicate with each other, and with other components, via a bus 1140. The bus 1140 may also link a display 1132, one or more input devices 1133 (which may, for example, include a keypad, a keyboard, a mouse, a stylus, etc.), one or more output devices 1134, one or more storage devices 1135, and various tangible storage media 1136. All of these elements may interface directly or via one or more interfaces or adaptors to the bus 1140. For instance, the various tangible storage media 1136 can interface with the bus 1140 via storage medium interface 1126. Computer system 1100 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 1101 (e.g., central processing unit(s) (CPU(s))) optionally contains a cache memory unit 1102 for temporary local storage of instructions, data, or computer addresses. Processor(s) 1101 are configured to assist in execution of computer readable instructions. Computer system 1100 may provide functionality as a result of the processor(s) 1101 executing software embodied in one or more tangible computer-readable storage media, such as memory 1103, storage 1108, storage devices 1135, and/or storage medium 1136. The computer-readable media may store software that implements particular embodiments, and processor(s) 1101 may execute the software. Memory 1103 may read the software from one or more other computer-readable media (such as mass storage device(s) 1135, 1136) or from one or more other sources through a suitable interface, such as network interface 1120. The software may cause processor(s) 1101 to carry out one or more processes or one or more steps of one or more processes described or illustrated herein. Carrying out such processes or steps may include defining data structures stored in memory 1103 and modifying the data structures as directed by the software.

The memory 1103 may include various components (e.g., machine readable media) including, but not limited to, a random access memory component (e.g., RAM 1104) (e.g., a static RAM "SRAM", a dynamic RAM "DRAM", etc.), a read-only component (e.g., ROM 1105), and any combinations thereof. ROM 1105 may act to communicate data and instructions unidirectionally to processor(s) 1101, and RAM 1104 may act to communicate data and instructions bidirectionally with processor(s) 1101. ROM 1105 and RAM 1104 may include any suitable tangible computer-readable media described below. In one example, a basic input/output system 1106 (BIOS), including basic routines that help to transfer information between elements within computer system 1100, such as during start-up, may be stored in the memory 1103.

Fixed storage 1108 is connected bidirectionally to processor(s) 1101, optionally through storage control unit 1107. Fixed storage 1108 provides additional data storage capacity and may also include any suitable tangible computer-readable media described herein. Storage 1108 may be used to store operating system 1109, EXECs 1110 (executables), data 1111, APV applications 1112 (application programs), and the like. Often, although not always, storage 1108 is a secondary storage medium (such as a hard disk) that is slower than primary storage (e.g., memory 1103). Storage 1108 can also include an optical disk drive, a solid-state memory device (e.g., flash-based systems), or a combination of any of the above. Information in storage 1108 may, in appropriate cases, be incorporated as virtual memory in memory 1103.

In one example, storage device(s) 1135 may be removably interfaced with computer system 1100 (e.g., via an external port connector (not shown)) via a storage device interface 1125. Particularly, storage device(s) 1135 and an associated machine-readable medium may provide nonvolatile and/or volatile storage of machine-readable instructions, data structures, program modules, and/or other data for the computer system 1100. In one example, software may reside, completely or partially, within a machine-readable medium on storage device(s) 1135. In another example, software may reside, completely or partially, within processor(s) 1101.

Bus 1140 connects a wide variety of subsystems. Herein, reference to a bus may encompass one or more digital signal lines serving a common function, where appropriate. Bus 1140 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 1100 may also include an input device 1133. In one example, a user of computer system 1100 may enter commands and/or other information into computer system 1100 via input device(s) 1133. Examples of an input device(s) 1133 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 1133 may be interfaced to bus 1140 via any of a variety of input interfaces 1123 (e.g., input interface 1123) including, but not limited to, serial, parallel, game port, USB, FIREWIRE, THUNDERBOLT, or any combination of the above.

In particular embodiments, when computer system 1100 is connected to network 1130, computer system 1100 may communicate with other devices, specifically mobile devices and enterprise systems, connected to network 1130. Communications to and from computer system 1100 may be sent through network interface 1120. For example, network interface 1120 may receive incoming communications (such as requests or responses from other devices) in the form of one or more packets (such as Internet Protocol (IP) packets) from network 1130, and computer system 1100 may store the incoming communications in memory 1103 for processing. Computer system 1100 may similarly store outgoing communications (such as requests or responses to other devices) in the form of one or more packets in memory 1103 and communicated to network 1130 from network interface 1120. Processor(s) 1101 may access these communication packets stored in memory 1103 for processing.

Examples of the network interface 1120 include, but are not limited to, a network interface card, a modem, and any combination thereof. Examples of a network 1130 or network segment 1130 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 1130, may employ a wired and/or a wireless mode of communication. In general, any network topology may be used.

Information and data can be displayed through a display 1132. Examples of a display 1132 include, but are not limited to, a liquid crystal display (LCD), an organic liquid crystal display (OLED), a cathode ray tube (CRT), a plasma display, and any combinations thereof. The display 1132 can interface to the processor(s) 1101, memory 1103, and fixed storage 1108, as well as other devices, such as input device(s) 1133, via the bus 1140. The display 1132 is linked to the bus 1140 via a video interface 1122, and transport of data between the display 1132 and the bus 1140 can be controlled via the graphics control 1121.

In addition to a display 1132, computer system 1100 may include one or more other peripheral output devices 1134 including, but not limited to, an audio speaker, a printer, and any combinations thereof. Such peripheral output devices may be connected to the bus 1140 via an output interface 1124. Examples of an output interface 1124 include, but are not limited to, a serial port, a parallel connection, a USB port, a FIREWIRE port, a THUNDERBOLT port, and any combinations thereof.

In addition or as an alternative, computer system 1100 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

In conclusion, the present invention provides, among other things, a method, system, and apparatus for sustaining a capacitively coupled plasma within a remote plasma source. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A remote plasma source comprising:
   a first electrode;
   a second electrode, one of the first or second electrodes at least partially surrounding the other;
   a chamber disposed between the first and second electrodes that is configured to couple to a processing chamber, the chamber including:
   a first dielectric component separating the first electrode from an interior of the chamber and DC isolating the first electrode from an interior of the chamber;
   a second dielectric component separating the second electrode from the interior of the chamber and DC isolating the second electrode from the interior of the chamber;
   a first path for the entry of a first fluid into the chamber; and
   a second path configured to provide a second fluid to the processing chamber, wherein the second fluid includes at least a portion of disassociated fluid created from the first fluid; and
   an RF power source input configured to couple to an RF power source and provide RF power to the first electrode when RF power is applied to the power source input, the RF power electrostatically coupling to the second electrode to electrostatically sustain a plasma within at least a portion of the chamber.

2. The remote plasma source of claim 1, wherein the second electrode is longer than the first electrode.

3. The remote plasma source of claim 1, wherein the second electrode is grounded.

4. The remote plasma source of claim 1, wherein the first and second electrodes have one or more beveled edges.

5. The remote plasma source of claim 1, wherein the first path radially provides the first fluid into the chamber.

6. The remote plasma source of claim 1, wherein the first path axially provides the first fluid into the chamber.

7. The remote plasma source of claim 1, wherein the first and second electrodes are coaxially aligned.

8. A method for sustaining a plasma in a capacitively coupled remote plasma source comprising:
   passing RF power between a first and second capacitively coupled electrodes that at least partially enclose a chamber of the capacitively coupled remote plasma source;
   sustaining a plasma within the chamber via the RF power that is capacitively coupled to the plasma;
   DC isolating the first electrode from the plasma via a first dielectric component that separates the first electrode from the plasma; and
   DC isolating the second electrode from the plasma via a second dielectric component that separates the second electrode from the plasma;
   providing a first fluid into the chamber;
   dissociating at least a portion of the first fluid via interaction with the plasma; and
   passing a second fluid to a processing chamber coupled to the capacitively coupled remote plasma source.

9. The method of claim 8, further comprising grounding one of the first or second electrodes.

10. The method of claim 8, wherein the first fluid is provided axially into the chamber.

11. The method of claim 8, wherein the first fluid is provided radially into the chamber.

12. The method of claim 8, further comprising concentrically arranging the first and second electrodes.

13. The method of claim 8, wherein the chamber wall is an inner surface of one of the first or second electrodes.

* * * * *